United States Patent [19]

Potter et al.

[11] Patent Number: 4,681,666

[45] Date of Patent: Jul. 21, 1987

[54] PLANARIZATION OF A LAYER OF METAL AND ANODIC ALUMINUM

[75] Inventors: Curtis N. Potter; Harry Kroger, both of Austin, Tex.

[73] Assignee: Microelectronics and Computer Technology Corporation, Austin, Tex.

[21] Appl. No.: 930,167

[22] Filed: Nov. 13, 1986

[51] Int. Cl.<sup>4</sup> ............................................... C25D 5/02
[52] U.S. Cl. ................................................ 204/15
[58] Field of Search ....................................... 204/15

[56] References Cited

U.S. PATENT DOCUMENTS 4,499,119  2/1985  Smith .................................... 204/15

Primary Examiner—T. M. Tufariello

Attorney, Agent, or Firm—Fulbright & Jaworski

[57] ABSTRACT

A planarization method of fabricating a layer of metal conductors embedded in a dielectric level. A coating of aluminum is anodized from the top but leaving a thickness of unanodized aluminum on the bottom. The top is masked and etched to provide a predetermined bare area which is etched out down to the unanodized aluminum. A metal is plated to the unanodized aluminum equal to the thickness of the unexposed anodic aluminum. The mask is removed and the unanodized aluminum is anodized. Therefore, the layer of metal and the dielectric anodic aluminum are planarized. Another anodizable metal may be used as an undercoat layer for completing the anodizing of the aluminum.

5 Claims, 5 Drawing Figures

PLANARIZATION OF A LAYER OF METAL AND ANODIC ALUMINUM

BACKGROUND OF THE INVENTION

It is known to fabricate multiple layers of metal conductors embedded in a dielectric layer and supported by a previous dielectric layer for connecting the conductors to various electrical components such as semiconductors. However, it is extremely desirable to avoid differences in thickness between the metal and the dielectric insulator in each of the layers. Failure to do this results in progressively larger steps occurring at the metal-dielectric edges as the number of layers increase. That is, it is desirable that planarization of each of the layers be achieved for each metal/dielectric layer.

The present invention is directed to a method of planarization utilizing an anodic aluminum dielectric in conjunction with a plated metal conductor to achieve planarization for each metal/anodic aluminum layer.

SUMMARY

The present invention is directed to a method of planarization of a layer of metal and anodic aluminum in a multilayered interconnect system. The method includes coating a substrate with aluminum and anodizing the aluminum from the top towards but not entirely to the bottom thereby leaving a thickness of unanodized aluminum on the bottom. The method further includes applying an etch mask to the top of the anodic aluminum leaving a predetermined area bare and etching out the anodic aluminum in the bare area down to the unanodized aluminum. Thereafter the method includes plating a metal to the unanodized aluminum in the etched out area in which the thickness of the plating is substantially equal to the thickness of the unetched anodic aluminum. Thereafter the mask is removed and the unanodized aluminum is anodized.

Another object of the present invention is the use of a refractory anodizable metal as an interconnect to insure complete anodization of the aluminum.

Other and further objects, features and advantages will be apparent from the following description of a presently preferred embodiment of the invention, given for the purpose of disclosure and taken in conjunction with the accompanying drawings.

DESCRIPTION OF THE PREFERRED EMBODIMENT

Figure 1:
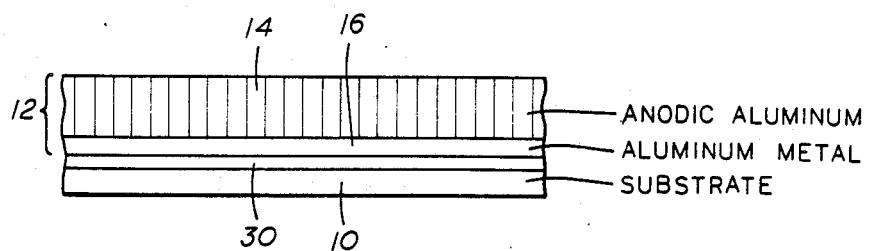
FIG. 1 is an elevational schematic view of the step of the present invention of coating a substrate with aluminum and anodizing the aluminum from the top towards but not entirely to the bottom.
Figure 2:
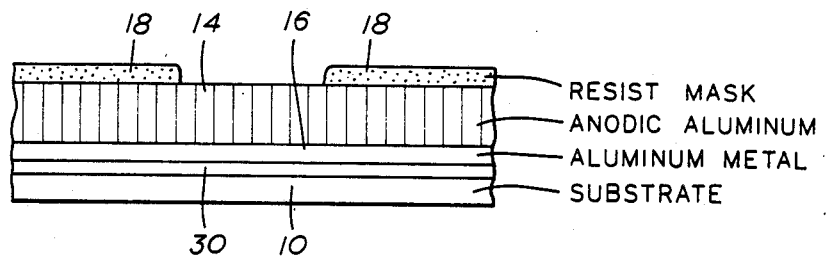
FIG. 2 is a view similar to FIG. 1 wherein an etched mask is applied to the top of the anodic aluminum leaving a predetermined area bare.

Referring now to the drawings and particularly to FIG. 1, a starting substrate 10 may be a semiconductor, insulating or metal wafer. A layer 12 is coated with aluminum to the desired thickness and the aluminum coating 12 is anodized from the top to almost the bottom, but not entirely to the bottom thereby providing a thickness of unanodized aluminum on the bottom. Thus, in one example a fifteen micron thick film of anodic aluminum 14, $Al_2O_3$, is provided above a two micron base 16 of aluminum metal. For anodizing the aluminum, a conventional sulfuric acid anodizing solution may be used and this solution produces about a 1.5 times thicker anodic aluminum film than the starting aluminum thickness. An undercoat of another refractory anodizable metal 30 may be used for thicker coats of aluminum and its use will be described hereinafter. However, the undercoat 30 may be omitted for thin coats of aluminum.

Figure 3:
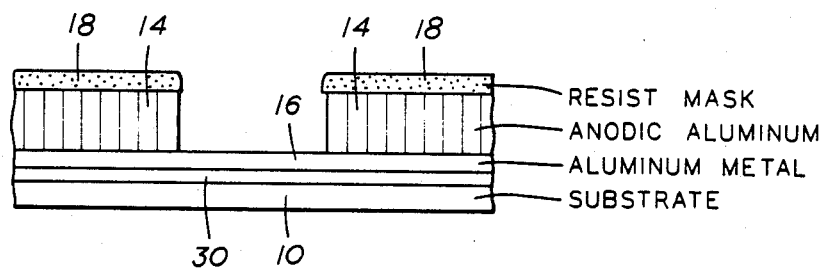
FIG. 3 is a view similar to FIG. 2 in which the anodic aluminum in the bare area is etched down to the unanodized aluminum.

Next a conventional photoresist mask 18 is applied to the top surface of the anodic aluminum 14 and a pattern is photolithographically printed in the resist mask 18, the mask 18 is developed, and cured, as is conventional, to leave a predetermined bare area 20 in the top of the anodic aluminum 14. Referring now to FIG. 3, using the etch mask 18, the anodic aluminum 14 is etched, such as using hydrofluoric acid and hydrofluoric acid diluted in water, down to the unanodized aluminum surface 16. Since the anodic aluminum 14 is columnar in microstructure, the etch is essentially anisotropic and yields a rather straight walled conductor groove in the anodic aluminum 14 as shown in FIG. 3.

Figure 4:
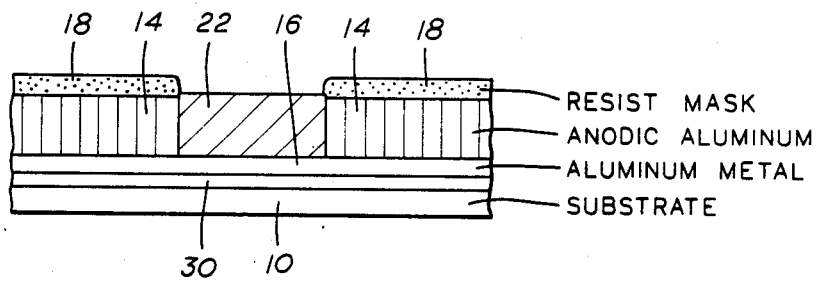
FIG. 4 is a view similar to FIG. 3 in which a metal is plated to the unanodized aluminum having a thickness equal to the thickness of the unetched anodic aluminum.

Referring now to FIG. 4, without removing the resist mask 18, and using the unanodized aluminum 16, as an electrical plating interconnect, a suitable metal 22 of choice, such as copper or gold, is plated by conventional techniques to a thickness substantially equal to the thickness of the anodic aluminum layer 14. The metal 22 will plate only on the exposed layer 16.

Figure 5:
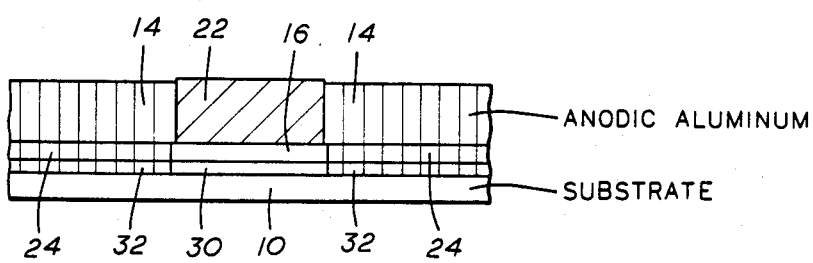
FIG. 5 is similar to FIG. 4 in which the mask is removed and the remaining aluminum is anodized.

Referring now to FIG. 5, the etch mask 18 is removed and the remaining thin aluminum layer 16 under the anodic aluminum 14 is anodized thereby anodizing layer 16 portion 24 to completion allowing the conductor 22 to be electrically isolated from any other conductor 22 (not shown). In particular it is to be noted that the surfaces of the plated conductor 22 and the anodic aluminum dielectric 14 are substantially planarized.

Additionally, by using the present process, which is applicable over a wide thickness range, the thickness of the anodized dielectric 12 may range from 1 micron to 150 microns thick. However, for thick aluminum it is difficult to completely convert the aluminum layer 12 to oxide. That is, as the anodization of the aluminum layer nears completion islands of aluminum of several microns width are electrically isolated from each other and the electrode cannot be anodized to completion. Therefore, in the case of a thick layer of aluminum, a thin undercoat 30 of another refractory anodizable metal is provided between the aluminum 12 and the substrate 10. The steps of the process of FIGS. 1–5 are performed and thereafter the electrical conductivity of layer 30 is used to anodize the aluminum 12 to completion. The layer 30 is subsequently anodized to anodize portions 32. The layer 30 may be niobium, tantalum, titanium, molybdenum or vanadium, etc.

The present invention, therefore, is well adapted to carry out the objects and attain the ends and advantages mentioned as well as others inherent therein. While a presently preferred embodiment of the invention has been given for the purpose of disclosure, numerous changes in the details of the steps of the method, will be readily apparent to those skilled in the art and which are encompassed within the spirit of the invention and the scope of the appended claims.

What is claimed is:

1. A method of planarization of a layer of metal and anodic aluminum in a multilayered electrical interconnect system comprising, coating a substrate with aluminum, anodizing the aluminum from the top towards but not entirely to the bottom leaving a thickness of unanodized aluminum on the bottom, applying an etch mask to the top of the anodic aluminum leaving a predetermined area bare, etching out the anodic aluminum in the bare area down to the unanodized aluminum, plating a metal to the unanodized aluminum in the etched out area, the thickness of the unetched plating being equal to the thickness of the anodic aluminum, removing the mask, and anodizing the unanodized aluminum.

2. The method of claim 1 wherein the thickness of the anodized aluminum is in the range of from 1 micron to 150 microns thick.

3. The method of claim 1 including, providing an undercoat of another anodizable metal between the coating of aluminum and the substrate, and using the undercoat to complete the anodizing of the unanodizable aluminum.

4. The method of claim 3 including, anodizing the other anodizable metal.

5. The method of claim 4 wherein the other anodizable metal is of a group consisting of niobium, molybdenum, tantalum, titanium and vanadium.

* * * * *